(12) United States Patent
Hackl

(10) Patent No.: US 11,391,785 B2
(45) Date of Patent: Jul. 19, 2022

(54) METHOD FOR INSULATION MONITORING OF A CONVERTER-SUPPLIED POWER SUPPLY SYSTEM

(71) Applicant: Bender GmbH & Co. KG, Gruenberg (DE)

(72) Inventor: Dieter Hackl, Fernwald (DE)

(73) Assignee: BENDER GMBH & CO. KG, Gruenberg (DE)

( * ) Notice: Subject to any disclaimer, the term of this patent is extended or adjusted under 35 U.S.C. 154(b) by 378 days.

(21) Appl. No.: 16/564,178

(22) Filed: Sep. 9, 2019

(65) Prior Publication Data

US 2020/0081072 A1 Mar. 12, 2020

(30) Foreign Application Priority Data

Sep. 10, 2018 (DE) .................... 10 2018 121 979.2

(51) Int. Cl.
*G01R 31/42* (2006.01)
*G01R 31/12* (2020.01)
(Continued)

(52) U.S. Cl.
CPC ......... *G01R 31/42* (2013.01); *G01R 31/1263* (2013.01); *H02M 5/44* (2013.01); *H02M 7/04* (2013.01); *H02M 7/48* (2013.01)

(58) Field of Classification Search
None
See application file for complete search history.

(56) References Cited

U.S. PATENT DOCUMENTS

| 9,632,131 | B2 * | 4/2017 | Broeckmann | ...... G01R 31/1272 |
| 9,929,558 | B2 * | 3/2018 | Hackl | ...................... H02H 3/17 |

(Continued)

FOREIGN PATENT DOCUMENTS

| CN | 104297570 A | 1/2015 |
| CN | 105610138 A | 5/2016 |

(Continued)

OTHER PUBLICATIONS

English machine translation of DE102004018918.
English machine translation of DE102013218836.

*Primary Examiner* — Jermele M Hollington
(74) *Attorney, Agent, or Firm* — Dickinson Wright PLLC; Andrew D. Dorisio

(57) ABSTRACT

The present invention relates to a method for determining an insulation resistance and for locating insulation faults in a power supply system whose active parts are ungrounded and which is supplied via a converter operated grounded and equipped with controlled power semiconductor switches. A common-mode voltage against ground is generated at the output of the converter and is superimposed on the ungrounded network as an active measuring voltage in order to measure the insulation resistance. The direct integration of the generation of the common-mode measuring voltage in the converter allows cost-effective implementation including similarly comprehensive insulation monitoring functions as those possible in fully ungrounded power supply systems. Furthermore, the method for determining the insulation resistance can be expanded into a method for locating insulation faults and thus for locating faulty system branches.

6 Claims, 8 Drawing Sheets

Figure 1:
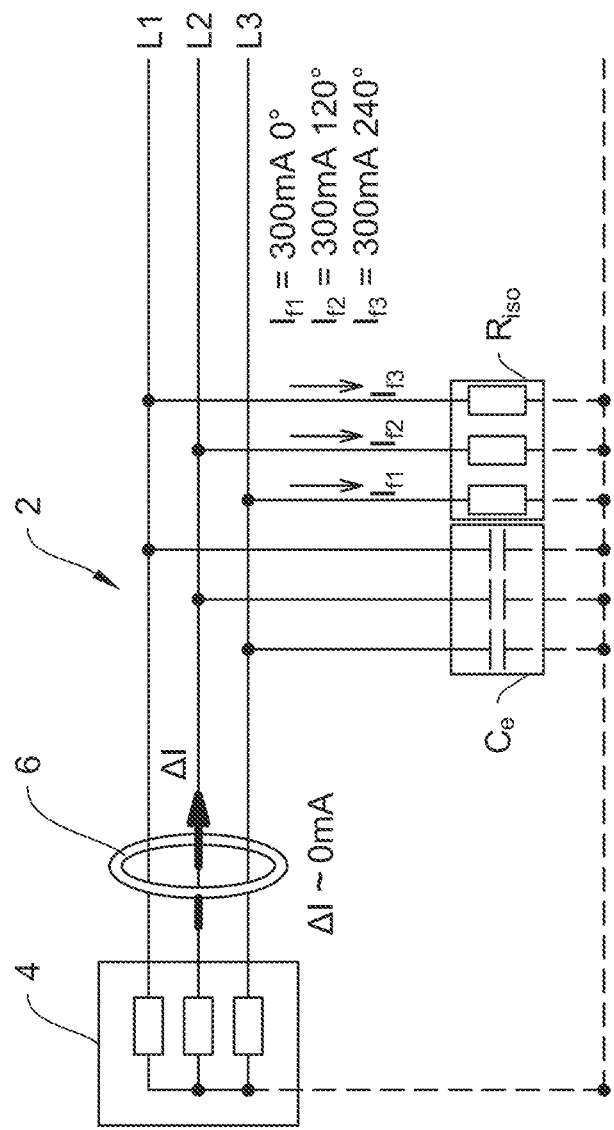

(51) Int. Cl.
*H02M 5/44* (2006.01)
*H02M 7/04* (2006.01)
*H02M 7/48* (2007.01)

(56) References Cited

U.S. PATENT DOCUMENTS

| | | | |
|---|---|---|---|
| 11,009,539 B2* | 5/2021 | Geiss | G01R 31/1272 |
| 2012/0014020 A1* | 1/2012 | Lehmann | H02S 50/00 |
| | | | 361/42 |
| 2017/0031373 A1* | 2/2017 | Hackl | H02H 3/16 |
| 2017/0227593 A1* | 8/2017 | Hackl | H02H 3/16 |
| 2021/0165026 A1* | 6/2021 | Schaefer | G01R 27/18 |
| 2021/0263093 A1* | 8/2021 | Hackl | G01R 31/1272 |

FOREIGN PATENT DOCUMENTS

| | | |
|---|---|---|
| CN | 108206670 A | 6/2018 |
| DE | 10355086 A1 | 6/2005 |
| DE | 102004018918 B3 | 7/2005 |
| DE | 102013218836 A1 | 3/2015 |
| EP | 2230522 A1 | 9/2010 |
| WO | 2018059823 A1 | 4/2018 |

\* cited by examiner

METHOD FOR INSULATION MONITORING OF A CONVERTER-SUPPLIED POWER SUPPLY SYSTEM

This application claims the benefit of German Patent Application No. DE 10 2018 121 979.2, filed Sep. 10, 2018, the disclosure of which is incorporated herein by reference.

TECHNICAL FIELD

The present invention relates to a method for determining an insulation resistance of a power supply system whose active parts are ungrounded and which is supplied via a converter operated grounded and equipped with controlled power semiconductor switches. A common-mode voltage against ground is generated at the output of the converter.

Furthermore, the invention relates to a method for locating insulation faults in a branched ungrounded power supply system comprising the features of a method for determining an insulation resistance.

BACKGROUND

With increasing automation and digitalization of industrial production, there is the need to convert the energy for current transmission provided by the source in terms of network configuration, network voltage and network frequency or to adapt it to the requirements of the loads connected to the power supply system.

According to standards (DIN VDE 0100-410 (VDE 0100-410):2007-06, IEC 60364-4-41:2005-12), a power supply system whose active parts are ungrounded is a power supply system whose active parts are isolated against ground or connected to ground via a sufficiently high impedance. A power supply system of this kind is also referred to as an ungrounded power supply system or IT system (French: isolé terre) and, accordingly, has an ungrounded network configuration.

Aside from the use of inverters, which supply a power supply system (alternating current) with energy (direct current) provided by a photovoltaic plant, for example, and the use of rectifiers in the architecture of direct-current networks, there is also a growing need for variable-speed electric drives that are supplied by the power supply system by way of a frequency converter. As used hereinafter, the term converter includes inverters, rectifiers and frequency converters.

Given the development of power electronics toward ever more powerful semiconductor circuits, current is converted electronically to an increasing extent using power semiconductor switches.

In the converter configuration most commonly used, the circuitry employed to realize the converter basically has (as a function of the number of phases in an AC power supply system) at least one bridge circuit composed of multiple parallel paths, each having at least two power semiconductor switches, irrespective of whether the converter is to function as an inverter, a rectifier or a converter. The power semiconductor switches are controlled by a control circuit by means of a control pulse pattern in such a manner that the desired output signal is generated at the output of the converter in the form of an AC voltage of desired frequency or in the form of a DC voltage.

Converters are used in various network configurations. When a converter is used in an ungrounded power supply system, there is the option of determining different network parameters that are relevant to the safe operation of the converter while monitoring the ungrounded power supply system using an insulation monitoring device (IMD) as required according to standard IEC61557-8. In particular, continuous monitoring of the insulation resistance, which is mandatory in an ungrounded power supply system, can take place reliably and largely independent of the magnitude of the network leakage capacitances of the ungrounded power supply system in a double-digit megaohm range as far down as the kiloohm range.

Using insulation monitoring devices according to product standard IEC61557-8, symmetrical and asymmetrical insulation faults can be detected. The additional fire hazard arising from symmetrical faults is detected by standard insulation monitoring devices, allowing measures to be taken in time. By looking at how the insulation resistance value develops over time, conclusions can be drawn as to moisture, contamination, aging and degradation. Maintenance measures can be planned in time, thus avoiding system downtimes. Thus, continuous insulation monitoring in the ungrounded power supply system provides an information advantage.

The state of the art does not offer any comparable monitoring options that are similarly reliable for a network constellation in which a converter that is operated grounded supplies a power supply system whose active parts are isolated against ground or connected to ground via a sufficiently high impedance, i.e. in which a grounded converter supplies an ungrounded power supply system connected downstream.

Hence, when using converters that are operated grounded, the aim is to limit the duration of the hazardous effect of a residual current on personnel and installations by means of protective devices, such as circuit breakers or residual current devices (RCD), i.e. to achieve fast turn-off times. A standstill of the turned-off system branch is accepted in this context. To keep the downtimes low, both maintenance personnel and spare parts are kept in reserve.

Aside from the mentioned protective devices (circuit breaker and residual current device (RCD)), residual current monitoring (RCM) systems according to product standard IEC62020 are used in critical installations that cannot be operated fully ungrounded. The aim of residual current monitoring is to achieve reduced maintenance and reduced downtimes in grounded converter systems, as well.

As a matter of principle, however, detection of symmetrical faults is impossible in residual current monitoring systems (monitoring gap). Because of the typically symmetrical structures in electrical systems, symmetrically flowing residual currents often constitute an operating state that is to be expected. Said operating state may be caused by evenly distributed moisture in combination with dirt or by uniform aging or degradation of the electrical insulation.

In addition to the disadvantage of non-detectable symmetrical residual currents, the sensitivity of residual current-based monitoring systems is distinctly dependent on network leakage capacitances present and on the leakage currents determined by them in an ungrounded power supply system as opposed to the measuring behavior of an insulation monitoring device.

In the residual current transducer of the residual current monitoring system, the root mean square is composed of the capacitive leakage current and the ohmic residual current. If a distinctly greater capacitively determined leakage current is flowing, an additionally occurring hazardous residual current causes an only minimal increase in the root mean square, which is why said hazardous residual current cannot be detected. According to the current state of the art, a reliable distinction between capacitive leakage currents and ohmic residual currents by purely passive measurement is impossible in a three-phase AC power supply system, in particular.

This imminent hazard has been addressed with conventional approaches such as short maintenance intervals, shorter intervals between repetitive tests, early replacement of critical equipment, stockpiling of critical components on site in order to keep repair times short in case of failure, on-call service in order to keep repair times short in case of failure, statistical documentation of failures and making prognoses of failures in the operation of a larger number of similar installations over a longer time, and building in redundancies.

However, these approaches prove to be too time-consuming and material-intensive specifically with regard to increasingly flexible production methods.

Moreover, to avoid a dangerous ground fault current within a fully grounded electrical drive system, unexamined patent application WO 2018/059823 A1 discloses generating a common-mode voltage signal in a converter of the drive system so as to anticipatorily detect a hazardous ground fault current of high frequency in the drive system. Not only is residual current detection limited to the grounded drive system, but detection of a symmetrical fault is also impossible because of the residual current-based measurement.

SUMMARY

Thus, the object of the present invention is to realize technical monitoring options that are comparable in terms of the insulation resistance to those available in a fully ungrounded power supply system for a power supply system whose active parts are isolated against ground or grounded via a sufficiently high impedance (ungrounded power supply system) and which is supplied by a converter that is not operated without grounding. In particular, the aim is for symmetrical insulation faults to be reliably detected and for the impact of the magnitude of the network leakage capacitances on the determination of the insulation resistance to be minimized.

This object is attained by a method that comprises the following steps according to the invention: superimposing the common-mode voltage as a measuring voltage for determining the insulation resistance of the ungrounded power supply system, detecting the measuring voltage in the ungrounded power supply system, detecting a measuring current that is flowing via the insulation resistance because of the measuring voltage in the ungrounded power supply system, and determining the insulation resistance by assessing the measuring current.

The basic idea of the present invention is based first of all on realizing active measuring of the insulation resistance for an ungrounded power supply system that is supplied by a converter operated grounded and on generating the measuring voltage needed for active measuring in the converter.

Thus, a common-mode measuring voltage source typically used for measuring the insulation resistance in ungrounded power supply systems, such as in the form of an insulation monitoring device (IMD), is not required because a common-mode voltage against ground generated in the converter is superimposed on the ungrounded network at the output of the converter, i.e. connected between each active conductor of the power supply system and ground. This measuring voltage is detected for assessment at the output of the converter at the interface with the power supply system to be monitored. By using the common-mode voltage as an active measuring voltage, symmetrical impedances against ground can be determined, in particular in case of symmetrical fault states. Since the common-mode voltage can be set largely independent of the supply voltage, determination of the insulation resistance is possible largely independent of the network leakage capacitances, largely unaffected by interfering components and in simultaneous compliance with regulations and/or standards.

The superimposed measuring voltage causes a measuring current that closes in a measuring circuit across the leakage impedances inherently present in the power supply system and across the grounded converter. When the frequency of the measuring current is sufficiently low, the magnitude of the measuring current is determined predominantly by the insulation resistance, i.e. by the ohmic part of the leakage impedance, because the conductance of the leakage capacitances, i.e. of the capacitive part of the leakage impedance, is negligible compared to the ohmic part at a low frequency. A measuring current that is proportional to the insulation resistance is detected at a central location, preferably at the output of the converter, so that the insulation resistance can be determined in connection with the known measuring voltage.

The direct integration of the common-mode measuring voltage generation in the converter thus allows cost-effective implementation including similarly comprehensive insulation monitoring functions as those possible in fully ungrounded power supply systems (power supply systems that are not supplied by a converter that is operated grounded).

In particular, possible fields of application for electrical installations that are connected to a converter operated grounded open up in smaller roof-mounted photovoltaic installations that are operated grounded; variable drives; wind energy plants that are operated grounded; industrial DC supply systems; a DC supply that is operated grounded, such as in telecommunication, in computer centers or in the medical field; converters operated grounded for blast furnace applications or in converters operated grounded in power-to-gas applications.

In another advantageous embodiment, the common-mode voltage is generated by generating pulse patterns for controlling the power semiconductor switches.

To generate an output signal of the converter as desired in terms of signal waveform and signal frequency, the power semiconductor switches of the converter are controlled using suitable pulse patterns. With multi-phase converters, symmetrical pulse patterns that cause a negligible common-mode voltage at the output of the converter are typically used. By changing the pulse pattern control, however, such as by an asymmetry of the control, a significant common-mode voltage against ground which can be used for measuring and monitoring tasks in the power supply system as per the invention can be generated at the output of the converter.

Advantageously, the pulse patterns are generated by a voltage displacement of a reference voltage for each phase using a bias voltage.

To achieve the desired DC voltage signal at the output of the converter, the pulse patterns for controlling the power semiconductors are modified in a suitable manner. This happens through a voltage displacement of a reference voltage for each phase using a bias voltage.

In another embodiment of the method, the bias voltage is set in such a manner that it has a square waveform with a fundamental frequency below a network frequency of the power supply system, resulting in a measuring frequency of the measuring voltage at the level of the fundamental frequency of the bias voltage.

The amplitude, the frequency and the waveform of the bias voltage are the main settable parameters of the bias voltage, these parameters mapping parameters of the desired common-mode voltage. In particular, the waveform and the frequency of the bias voltage are reflected in the waveform and the frequency of the common-mode voltage and thus form a measuring voltage that is suitable for determining the insulation resistance and that can be advantageously adapted to the system parameters of the power supply system to be monitored, such as the magnitude of the leakage capacitances.

Hence, it is advantageous in the case of great network leakage capacitances, such as in widely branched ungrounded power supply systems, to select a frequency of the bias voltage and thus a resulting equal frequency of the common-mode voltage, i.e. of the measuring voltage, that is significantly lower than the network frequency of the ungrounded power supply system. Additionally, when a square waveform is used, known algorithms for signal processing in insulation monitoring devices for ungrounded power supply systems can be employed.

In addition to the adaption of the settable parameters of the bias voltage in consideration of the network leakage capacitances present, these parameters may also be optimized in consideration of the impact of possible interference signals.

The method can be advantageously employed in electrical installations in which the converter is configured as an inverter or as a rectifier or as a frequency converter.

Hence, the method according to the invention, in particular the generation of the pulse patterns for controlling the power semiconductor switches, is independent of the function in which the converter is used.

So the method is applicable, for example, when a DC power supply system connected to the converter functioning as a rectifier is to be monitored or if an AC power supply system is operated downstream of the converter functioning as an inverter or as a frequency converter.

Possible applications of the method according to the invention thus are, for example: photovoltaic installations that are operated grounded on the input side of the photovoltaic inverter; industrially used rectifier-supplied DC power supplies having a grounded network configuration on the AC side; frequency converter drives having a grounded network configuration on the AC input side; rectifier-supplied DC power supplies of computer centers having a grounded network configuration on the AC side; rectifier-based uninterruptible power supplies (UPS) having a grounded network configuration on the AC side; inverter drives of electric vehicles having a galvanic connection between the drive side and the vehicle body.

Based on the method according to the invention for determining the insulation resistance, the object of monitoring in a branched power supply system is further attained by a method for locating insulation faults further comprising the following steps: detecting a residual current caused by the measuring voltage in a system branch to be monitored in the ungrounded power supply system by means of a residual current measuring device and assessing the residual current to detect a system branch that exhibits an insulation fault.

The method according to the invention for determining the insulation resistance can be enhanced by a step of detecting residual current caused by the measuring voltage in a system branch to be monitored in the ungrounded power supply system by measuring a residual current to arrive at a method that serves to locate insulation faults and thus to locate faulty system branches.

To this end, a residual current measuring device is installed in a manner known from the state of the art in each system branch to be monitored, said residual current measuring device detecting a residual current driven by the common-mode voltage as a measuring voltage in a system branch affected by an insulation fault.

In its function as a measuring voltage (test voltage), the common-mode voltage generated in the converter replaces a test current generator as typically used in insulation fault locating devices, which would require complex installation.

Advantageously, a partial network leakage capacitance of the system branch to be monitored is determined.

Based on the measuring voltage detected in the system branch to be monitored and on the residual current caused by the measuring voltage, the (partial) network leakage capacitance of the system branch to be monitored can be determined.

BRIEF DESCRIPTION OF THE DRAWING FIGURES

Other advantageous features are apparent from the following description and from the drawings, which show preferred embodiments of the invention by way of example.

Figure 2:
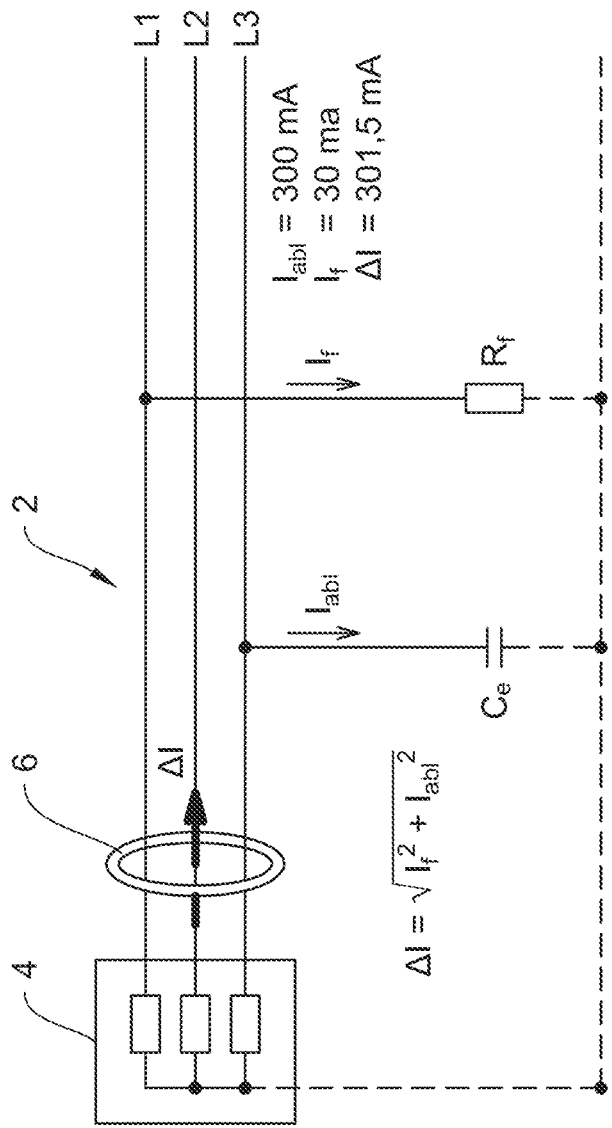
Figure 3:
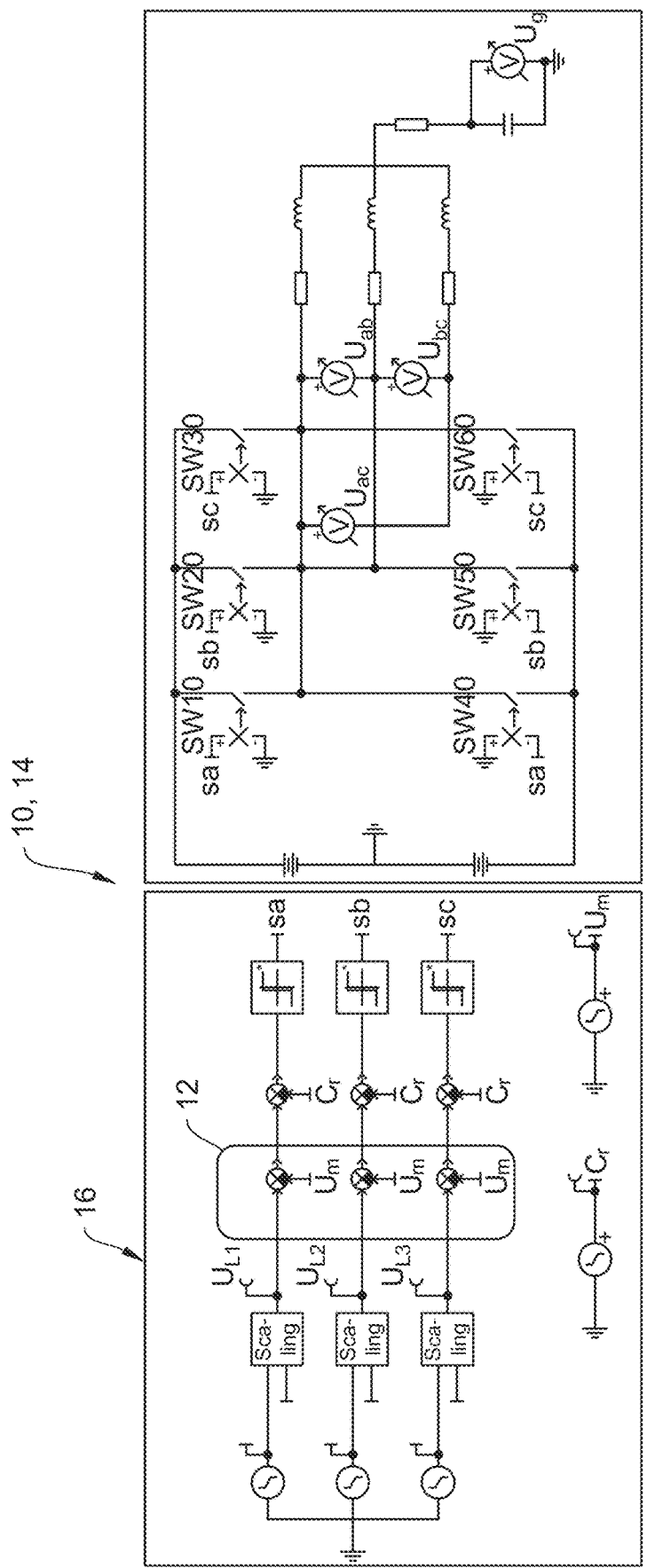
Figure 4A:
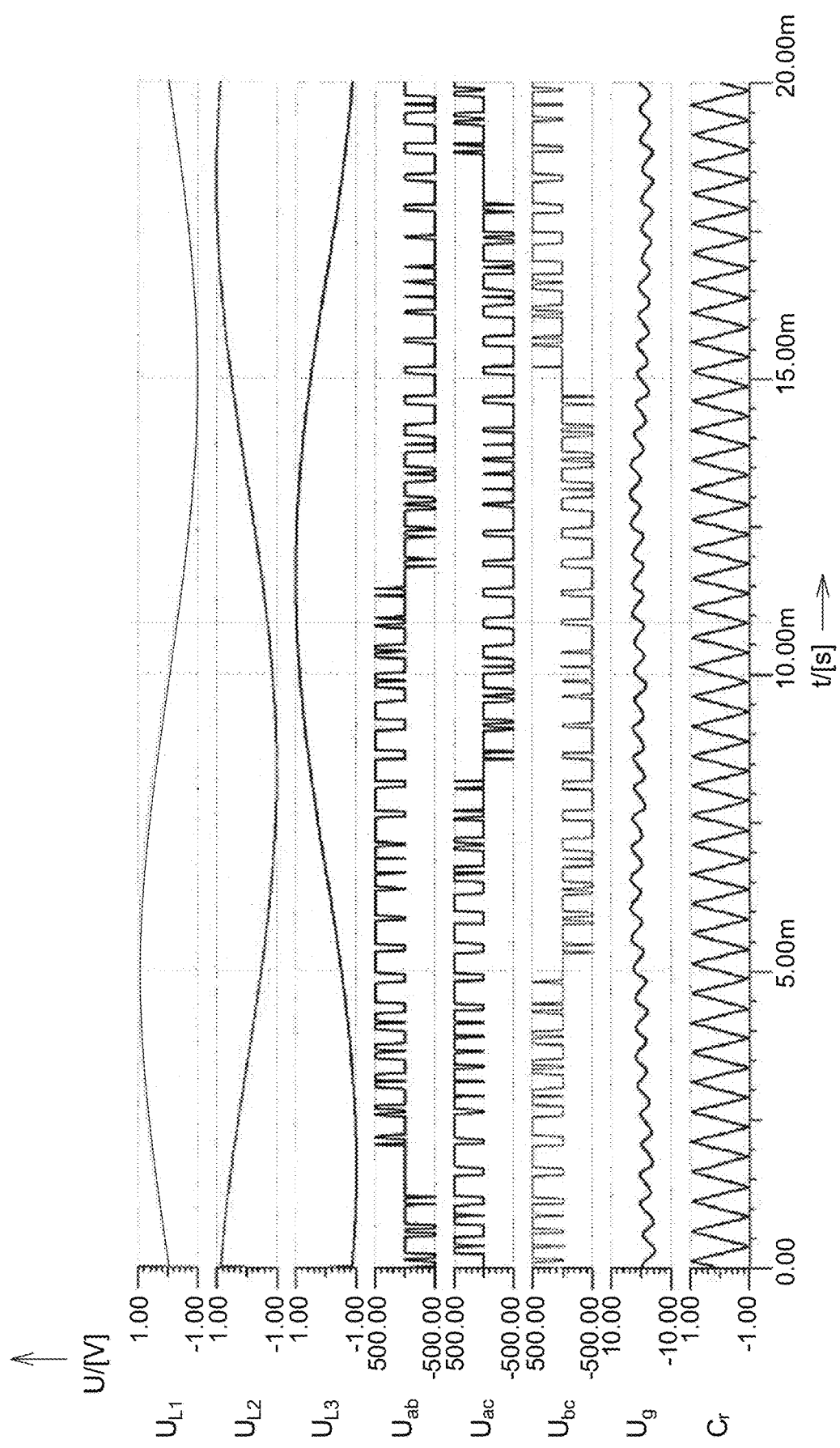
Figure 4B:
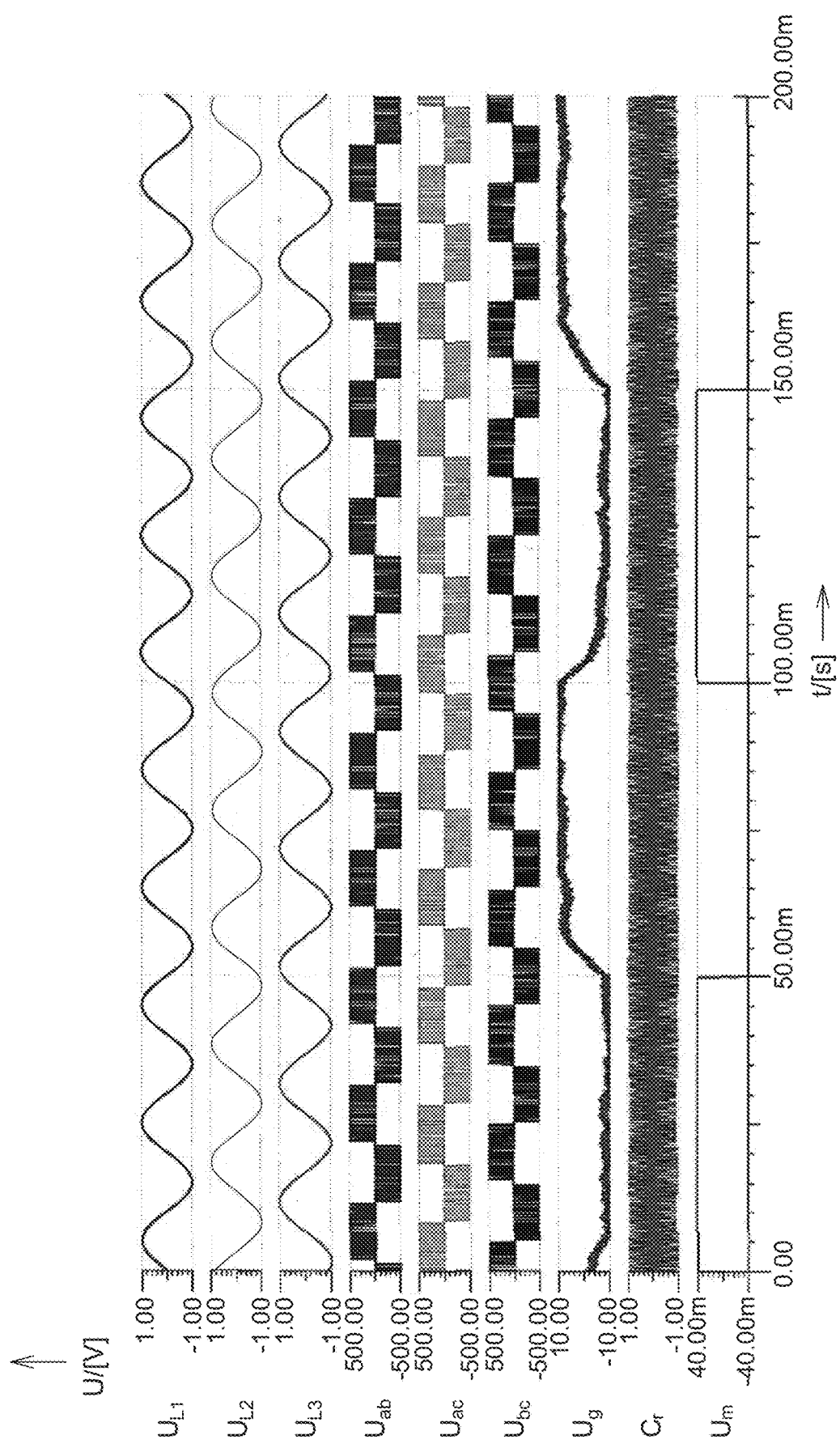
Figures 5A, 5B:
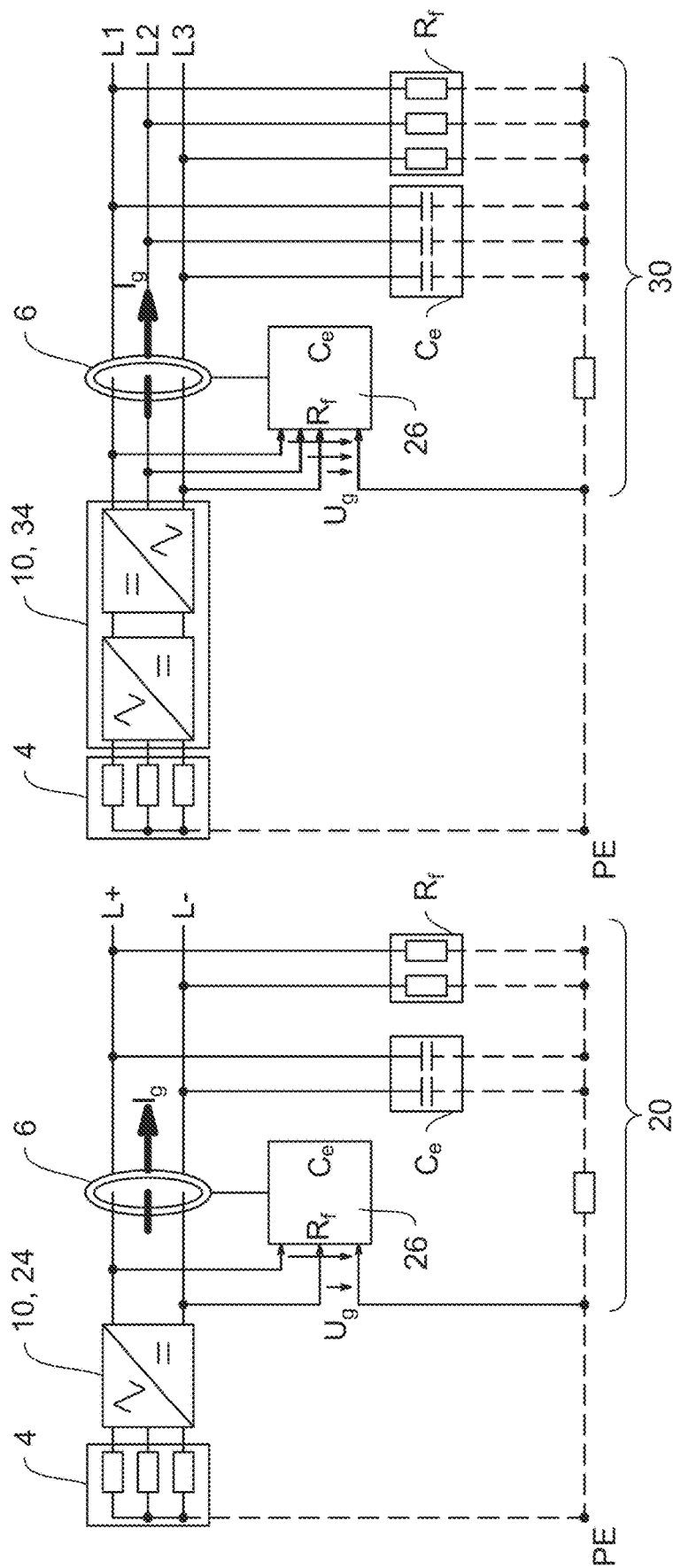
Figure 6A:
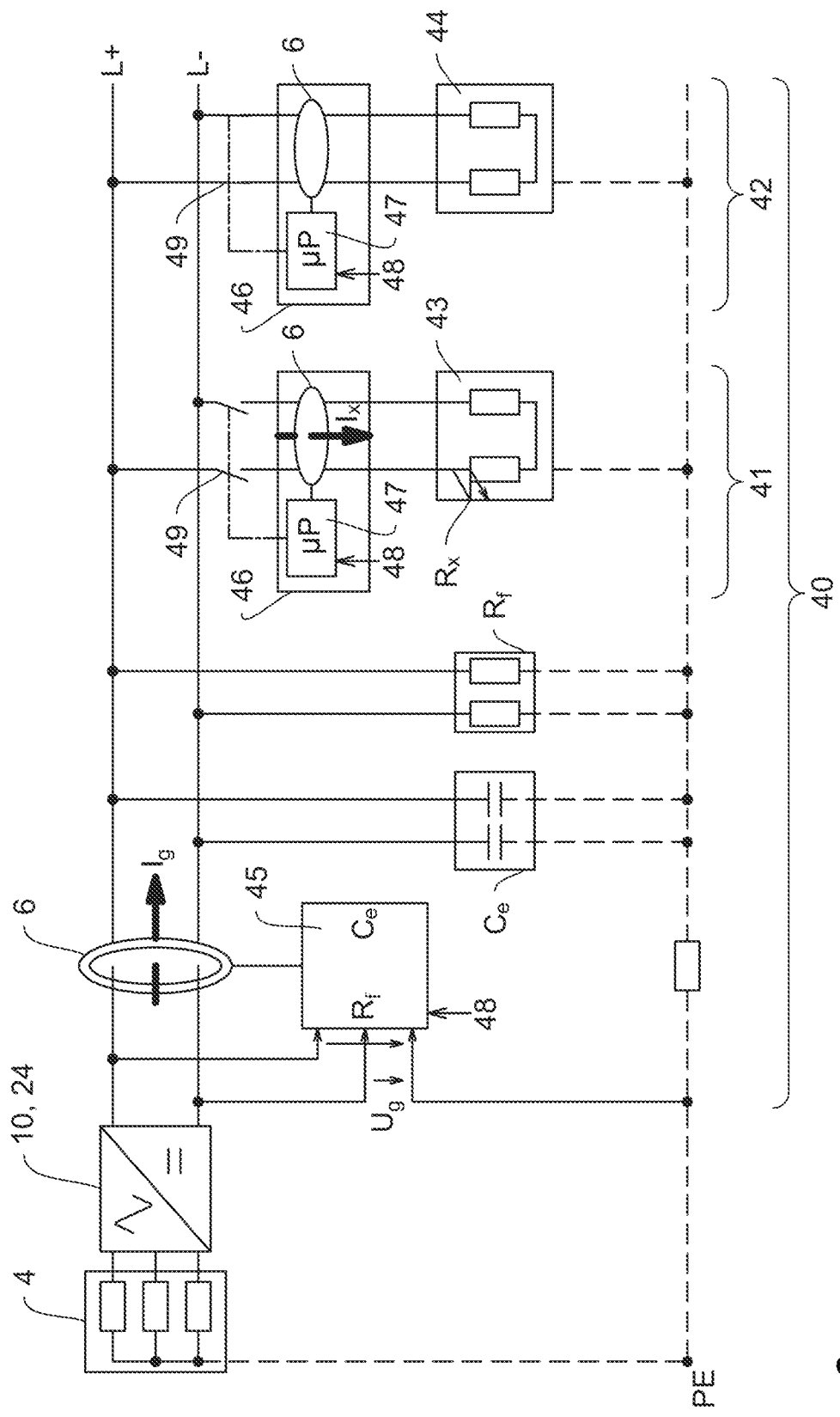
Figure 6B:
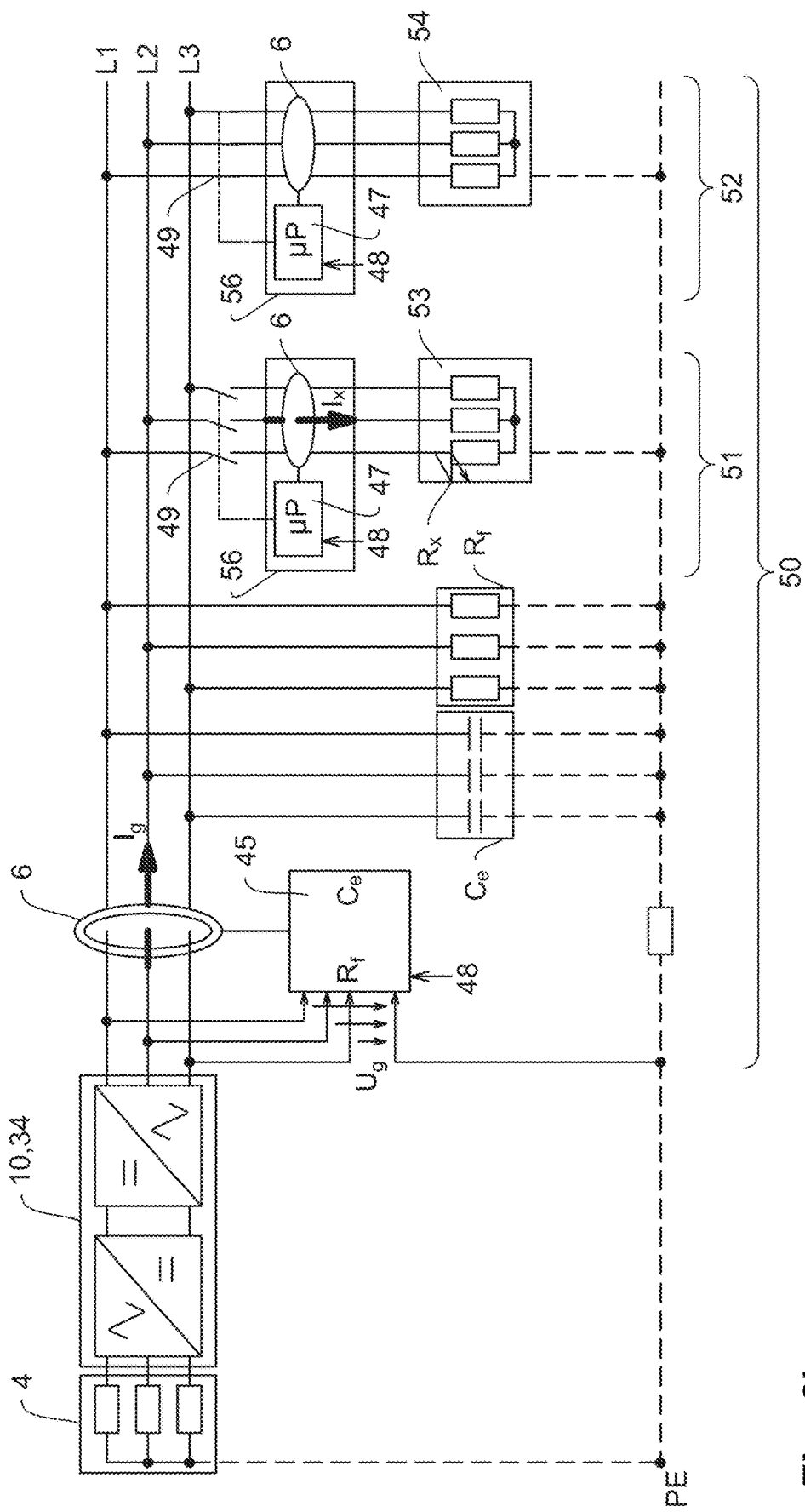

FIG. 1: is an illustration of the principle of a monitoring gap "symmetrical fault" of passive residual current measuring technology, FIG. 2: is an illustration of the principle of an impact of capacitive leakage currents on the measuring sensitivity of residual current measurements, FIG. 3: shows a simulation of a converter (inverter with STC modulation) with a voltage displacement for generating a common-mode voltage, FIG. 4a: shows simulation results (signal waveforms) of the converter simulation of FIG. 3 without voltage displacement, FIG. 4b: shows simulation results (signal waveforms) of the converter simulation of FIG. 3 with voltage displacement, FIG. 5a: shows insulation monitoring according to the invention in an ungrounded DC power supply system, FIG. 5b: shows insulation monitoring according to the invention in an ungrounded AC power supply system, FIG. 6a: shows a localization according to the invention of insulation faults in a branched ungrounded DC power supply system, and FIG. 6b: shows a localization according to the invention of insulation faults in a branched ungrounded AC power supply system.

DETAILED DESCRIPTION

FIG. 1 is an illustration of a principle of a monitoring gap "symmetrical fault" which can occur when passive residual current measuring technology is used. What is shown is a power supply system 2 which comprises active conductors (phase conductors, phases) L1, L2 and L3 and which is grounded via a power source 4. A residual current measuring device 6 detects the vectorial sum of the currents flowing in conductors L1, L2 and L3. Residual current measuring device 6 may be part of a residual current protective device (RCD) or of a residual current monitor (RCM).

Because of the typically symmetrical structures in electrical systems, a symmetrical fault case, i.e. an insulation fault that affects all three conductors L1, L2 and L3 in the same way, can typically be assumed when the insulation deteriorates. In FIG. 1, this insulation fault is illustrated by insulation resistance $R_{iso}$—in the fault case also by $R_f$ (insulation fault or insulation fault resistance)—which is effective between conductors L1, L2, L3 (including all connected equipment) and ground and which models the complex-value leakage impedance of entire power supply system 2 as a concentrated element together with leakage capacitance $C_e$.

Because of the symmetrical phasing, the vectorial sum of residual currents $I_{f1}$, $I_{f2}$ and $I_{f3}$ flowing via insulation resistance $R_{iso}$ in conductors L1, L2 and L3—and thus resulting residual current $\Delta I$—is close to zero.

Despite the significant magnitude of residual currents $I_{f1}$, $I_{f2}$ and $I_{f3}$, they cannot be detected and cause a monitoring gap in connection with the occurrence of symmetrical faults when passive residual current measuring technology is used.

FIG. 2 is an illustration of the principle of the impact of capacitive leakage currents on the measuring sensitivity of residual current measurements.

One disadvantage that occurs when using residual current-based monitoring systems as compared to the use of insulation monitoring devices (IMD) installed according to standards is that the measuring behavior of residual current-based monitoring systems depends distinctly on network leakage capacitances present and on the leakage currents determined by them. If a significant capacitive leakage current $I_{ab1}$ is flowing already, the vectorial addition with a smaller, yet still hazardous residual current $I_f$ results in only little increase of the residual current, which cannot be reliably detected in case of an insufficient sensitivity of the residual current measuring device. The numerical example in FIG. 2 illustrates an only marginal increase of 1.5 mA in residual current $\Delta I$ when a residual current $I_f$ of 30 mA occurs in addition to inherently present leakage current $I_{ab1}$ (operational currents are not taken into account).

FIG. 3 shows a simulation model of a converter 10 with a voltage displacement 12 for generating a common-mode voltage as a measuring voltage $U_g$.

In the simulation model, converter 10 is modelled as an inverter 14 whose power semiconductor switches SW10 to SW60 are controlled by a control circuit 16 by means of pulse patterns sa, sb, sc. In the model, the generation of pulse patterns sa, sb, sc for controlling power semiconductor switches SW10 to SW60 using the STC modulation method (sine-triangle comparison in the center aligned mode) is shown. The modification of control pulse patterns sa, sb, sc for generating an optimized measuring voltage $U_g$ as explained below is also possible using other known modulation methods (STC-THI, CSVM, DSVM type A, DSVM type B, DSVM type C).

In the STC method described, control pulse patterns sa, sb, sc are basically modulated in a known way by modulation of a higher-frequency triangular carrier signal $C_r$ with standardized sine reference voltages $U_{L1}$, $U_{L2}$, $U_{L3}$ in such a manner that output voltages $U_{ab}$, $U_{ac}$, $U_{bc}$ as sinusoidal as possible are generated.

Without voltage displacement 12, i.e. when carrier signal $C_r$ is controlled symmetrically, no significant common-mode voltage would occur as a measuring voltage $U_g$ at the output of the inverter (cf. signal waveform of measuring voltage $U_g$ in FIG. 4a).

However, if the control pulse pattern generation in control circuit 16 is modified by voltage displacement 12 to the effect that a bias voltage $U_m$ is superimposed on respective sine reference voltages $U_{L1}$, $U_{L2}$, $U_{L3}$ for each phase L1, L2, L3, a common-mode voltage against ground that is measurable and exploitable as measuring voltage $U_g$ occurs at the output of inverter 14 (cf. signal waveform of measuring voltage $U_g$ in FIG. 4b).

FIG. 4a shows signal waveforms that occur as simulation results from the converter simulation of FIG. 3 without voltage displacement 12.

To illustrate the basic effect of an inverter operation, the three sine reference voltages $U_{L1}$, $U_{L2}$ and $U_{L3}$ are shown, which are offset from each other by 120°, have a frequency of 50 Hz and each modulate higher-frequency (2 kHz) triangular carrier signal $C_r$. As a superimposition of the center tapping of the bridge branches of inverter 14, resulting output voltages $U_{ab}$, $U_{ac}$ and $U_{bc}$ do have largely square impulses, but they contain the frequency of sine reference voltages $U_{L1}$, $U_{L2}$ and $U_{L3}$ as an undesired fundamental oscillation.

The occurring common-mode voltage (measuring voltage $U_g$) amounts to only a few 100 millivolt and is not usable, or usable to a limited degree only, as a measuring voltage $U_g$ for insulation monitoring or for locating insulation faults in power supply networks.

FIG. 4b shows the signal waveforms as simulation results of the converter simulation of FIG. 3 with voltage displacement 12.

Voltage displacement 12 superimposes a bias voltage $U_m$ having a square waveform, an amplitude of ±40 mV and a fundamental frequency of 10 Hz on each of sine reference voltages $U_{L1}$, $U_{L2}$ and $U_{L3}$.

As a result, a common-mode voltage against ground that has an amplitude of ±10 V and also a fundamental frequency of 10 Hz occurs as a measuring voltage $U_g$ (take note of the time scale compressed in comparison to FIG. 4a). Given that this measuring signal frequency of 10 Hz is significantly lower than the network frequency of 50 Hz, measuring voltage $U_g$ thus generated can be used to determine the insulation resistance even if great network leakage capacitances are present because capacitive leakage currents $L_{ab1}$ (FIG. 2) have largely abated and do not distort the measurement result.

FIGS. 5a and 5b show applications of the insulation monitoring according to the invention for an ungrounded DC power supply system (FIG. 5a) and for an ungrounded AC power supply system (FIG. 5b).

FIG. 5a shows a converter 10 which is configured as a rectifier 24 and which is operated grounded via a power source 4. An ungrounded DC power supply system comprising active conductors L+ and L− is connected to the output side of rectifier 24. Leakage capacitances $C_e$ and insulation resistances $R_f$ of ungrounded power supply system 20 are illustrated as concentrated elements against ground PE (protective conductor PE).

A monitor 26 measures measuring voltage $U_g$ provided according to the invention by rectifier 24 an the one hand and receives the value of a measuring current ((common-mode) residual current) $I_g$ caused by measuring voltage $U_g$ on the other hand, said measuring current $I_g$ being detected as a sum current on active conductors L+ and L− by a residual current measuring device 6. Insulation resistance $R_f$ is calculated from these two variables.

By modifying control pulse patterns sa, sb, sc in controlled rectifier 24 (FIG. 3), measuring voltage $U_g$ can be adapted to ungrounded power supply system 20 in such a manner that—unlike in case of a residual current-based detection without an adapted measuring signal according to FIG. 2—leakage capacitances $C_e$ and accompanying leakage currents $I_{ab1}$ do not have any substantial deteriorating effect on the measuring result.

Thus, the method according to the invention for determining insulation resistance $R_f$ provides the same functionality with the same reliability as a standard insulation monitoring device (IMD), with the advantage that no external common-mode measuring voltage source requiring elaborate installation is required.

Moreover, the magnitude of leakage capacitance $C_e$ can be determined in addition to insulation resistance $R_f$ in monitoring device 26.

FIG. 5b shows an application in which converter 10 is configured as a frequency converter 34 which is operated grounded via a power source 4. An AC power supply system 30 is connected to the output of frequency converter 34. Here, too, insulation resistance $R_f$ and, if applicable, leakage capacitance $C_e$ are determined in a monitor 26, which assesses measuring voltage $U_g$ generated by the frequency converter and measuring current $I_g$ caused by said measuring voltage $U_g$.

FIGS. 6a and 6b show a localization according to the invention of insulation faults in a branched ungrounded DC power supply system (FIG. 6a) operated by grounded rectifier 24 and in a branched ungrounded AC power supply system (FIG. 6b) supplied by grounded frequency converter 34.

Branched ungrounded DC power supply system 40 of FIG. 6a has two system branches 41, 42 to each of which a load 43, 44 is connected and each of which can be separated from the main system using a separating device 49.

Analogously to the main system, system branches 41, 42 and system branches 51, 52 of FIG. 6b have—like any power supply system—inherently present (partial) insulation resistances and (partial) network leakage capacitances, neither of which are shown.

In the event of an insulation fault $R_x$ in a system branch 41 due to faulty insulation on a load 43 as illustrated, for example, a closed current path is formed, which closes via insulation fault $R_x$ and grounded rectifier 24 and in which a residual current $I_x$ is flowing.

An assessing device 46 is disposed in each of system branches 41, 42. Assessing devices 46 each have a residual current measuring device 6 for branch-selective detection of (potential) residual current $I_x$ which is driven as a common-mode current by measuring voltage $U_g$ (common-mode voltage) generated in rectifier 24. Assessing devices 46 each further comprise a microprocessor 47 and an interface 48 for transmitting detected residual current h.

An enhanced monitor 45 additionally has a (receiving) interface 48 for receiving residual current $I_x$ transmitted by assessing devices 46.

Based on residual current measuring devices 6 installed in the main system and in system branches 41, 42, the current path formed by residual current $I_x$ can be traced and, thus, faulty system branch 41 can be detected.

In the event that the power supply system is fault-free, the (partial) insulation resistance and/or the (partial) network leakage capacitance of respective monitored system branches 41, 42 can be calculated in enhanced monitor 45 from measuring voltage $U_g$ measured by enhanced monitor 45 and from (common-mode) measuring currents flowing in respective monitored system branches 41, 42 and transmitted to enhanced monitor 45 by assessing devices 46.

The assessment results can be locally stored, locally displayed or transmitted to a superordinate control center in order to initiate corresponding safety measures.

Alternatively, the (partial) insulation resistance value of system branch 41, 42 to be monitored and, optionally, its (partial) network leakage capacitance can be determined directly in respective assessing device 46. In this case, enhanced monitor 45 distributes the information on measuring voltage $U_g$ to assessing devices 46 so as to allow branch-selective determination in respective assessing device 46 "on site".

System branches 41, 42 that are assessed as critical can be turned off via respective microprocessor 47 and separating devices 49.

In terms of structure and function, the illustration in FIG. 6b basically corresponds to the illustration in FIG. 6a with the exception that instead of the branched ungrounded DC power supply system 40, a branched ungrounded AC power supply system 50 comprising two system branches 51, 52 is connected to the output of a frequency converter 34 operated grounded. Multi-phase loads 53, 54 are connected to system branches 51, 52, insulation fault $R_x$ having occurred in one load 51.

Each system branch 51, 52 has an assessing device 56 comprising a microprocessor 47, a residual current measuring device 6, and a three-phase separating device 59 controlled via microprocessor 47.

The invention claimed is:

1. A method for determining an insulation resistance ($R_f$) of a power supply system (20, 30, 40, 50) whose active parts are ungrounded and which is supplied via a converter (10, 14, 24, 34) operated grounded and equipped with controlled power semiconductor switches (SW10, SW20, SW30, SW40, SW50, SW60), the method comprising the following steps:

generating a common-mode voltage against ground at the output of the converter (10, 14, 24, 34), wherein the common-mode voltage is generated by generating pulse patterns (sa, sb, sc) for controlling the power semiconductor switches (SW10, SW20, SW30, SW40, SW50, SW60), superimposing the common-mode voltage as a measuring voltage ($U_g$) for determining the insulation resistance ($R_f$) of the ungrounded power supply system (20, 30, 40, 50), detecting the measuring voltage ($U_g$) in the ungrounded power supply system (20, 30, 40, 50), detecting a measuring current ($I_g$) which is flowing in the ungrounded power supply system (20, 30, 40, 50) via the insulation resistance ($R_f$) because of the measuring voltage ($U_g$), and determining the insulation resistance ($R_f$) by assessing the measuring current ($I_g$).

2. The method according to claim 1, wherein the pulse patterns (sa, sb, sc) are generated by a voltage displacement (12) of a reference voltage ($U_{L1}$, $U_{L2}$, $U_{L3}$) for each phase (L1, L2, L3) of the converter (10, 14, 24, 34) using a bias voltage ($U_m$).

3. The method according to claim 2, wherein the bias voltage ($U_m$) is set in such a manner that it has a square waveform with a fundamental frequency below a network frequency of the power supply system (20, 30, 40, 50), resulting in a measuring frequency of the measuring voltage ($U_g$) at the level of the fundamental frequency of the bias voltage ($U_m$).

4. The method according to claim 1, wherein an application in which the converter (10, 14, 24, 34) is configured as an inverter (14) or as a rectifier (24) or as a frequency converter (34).

5. A method according to claim 1, the method further comprising the steps of:
- detecting a residual current ($I_x$) caused by the measuring voltage ($U_g$) in a system branch (41, 42, 51, 52) to be monitored in the ungrounded power supply system (40, 50) by means of a residual current measuring device (6),
- assessing the residual current ($I_x$) to detect a system branch (41, 51) exhibiting an insulation fault ($R_x$).

6. The method according to claim 5, wherein determining a partial insulation resistance and/or a partial network leakage capacitance of the system branch (41, 42, 51, 52) to be monitored.

* * * * *